United States Patent [19]

Yang

[11] Patent Number: 4,797,609
[45] Date of Patent: Jan. 10, 1989

[54] LED MONITORING WITHOUT EXTERNAL LIGHT DETECTION

[75] Inventor: J. Leon Yang, Norwalk, Conn.

[73] Assignee: The Perkin-Elmer Corporation, Norwalk, Conn.

[21] Appl. No.: 547,550

[22] Filed: Dec. 12, 1983

Related U.S. Application Data

[63] Continuation of Ser. No. 266,267, May 22, 1981.

[51] Int. Cl.⁴ ............................................. G01R 31/26
[52] U.S. Cl. ............................ 324/158 D; 324/158 R
[58] Field of Search ...................... 324/158 D, 158 R; 250/551; 455/606

[56] References Cited

U.S. PATENT DOCUMENTS

| | | | |
|---|---|---|---|
| 4,321,707 | 3/1982 | Beasley et al. | 455/606 |
| 4,489,447 | 12/1984 | Chik et al. | 324/158 D |
| 4,493,113 | 1/1985 | Forrest et al. | 455/606 |

Primary Examiner—Ernest F. Karlsen
Attorney, Agent, or Firm—Thomas P. Murphy; Edwin T. Grimes; Francis L. Masselle

[57] ABSTRACT

An apparatus and method for monitoring the light intensity of individual light emitting diodes in an array of light emitting diodes. Means are provided to measure current flow through an unenergized diode adjacent to an energized diode. Current flow through the unenergized diode is porportional to light intensity of the light emitted by its energized adjacent diode.

3 Claims, 1 Drawing Sheet

LED MONITORING WITHOUT EXTERNAL LIGHT DETECTION

This application is a continuation of application Ser. No. 266,267 filed May 22, 1981.

BACKGROUND OF THE INVENTION

Arrays of individually addressable light emitting diodes have been found to be useful in exposing film used in sophisticated camera systems of the type used in aircraft or orbiting satellites for providing highly resolved photographs of the earth's surface and objects thereon. In such systems the image seen by the camera is converted to digital form. Each data bit which is representative of a picture element or pixel is utilized to energize selected ones of a large number of light emitting diodes disposed in arrays. The film strip is transported past the arrays of light emitting diodes and is exposed by the light from the energized light emitting diodes. This results in highly resolved photographs reproducing in crisp detail very minute objects.

One problem associated with such systems is the accurate measurement of light intensity of the light emitting diodes to assure that the film is being properly exposed, i.e., not over exposed or under exposed. Conventional light monitors utilizing external optics have been found to be inadequate for measuring light intensity of the light emitted from the diodes. For example, use of reflectors disposed in the light path of the diodes to reflect the light to a conventional light monitor have been found to be impractical due to the large number and close spacing of the diodes.

BRIEF SUMMARY OF THE INVENTION

The present invention relates to an apparatus and method for monitoring light intensity of light emitting diodes without the need for external optics. More particularly, the present invention monitors the light intensity of a light emitting diode by measuring the current through an adjacent unenergized light emitting diode. Since current through an unenergized light emitting diode is linearly proportional to the light emitted from the adjacent energized light emitting diode, it is possible to monitor light intensity by utilizing current measuring devices connected to the unenergized light emitting diodes.

DESCRIPTION

Figure 1:
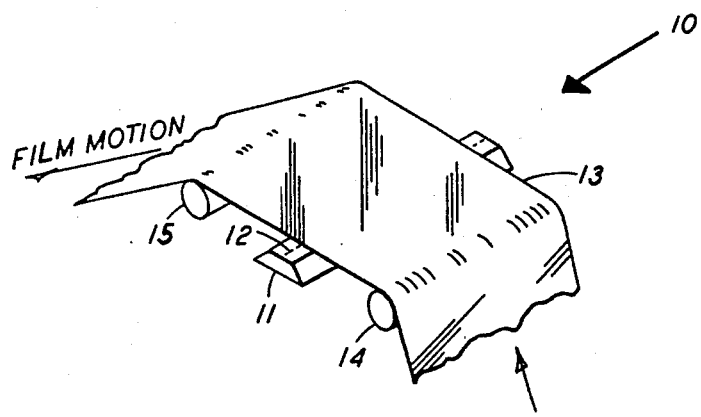
FIG. 1 illustrates a typical optical recorder utilizing a light emitting diode array.

Referring to FIG. 1 there is shown an optical recorder 10. The optical recorder 10 comprises a block 11 containing light emitting diodes array 12 hereinafter referred to as LED array 12. While LED array 12 is shown as a single row of LED's it may comprise two or more rows if desired. Each row contains thousands of LED's disposed on a chip and each LED is capable of being individually energized to emit light in accordance with picture elements received by a camera and converted to data. The data is in digital form and each LED is energized or not energized by a bit, 1 or 0, associated with a particular picture element or pixel. The means for processing data is not part of this invention and is not disclosed. A strip of film 13 is disposed adjacent the LED array 11 and is transported past the LED array 11 by means not shown. Rollers 14 and 15 determines the position of the film relative to the LED array 121 and guides the film therepast. The film strip 11 is part of a roll of film to be exposed by the LED array 12 in accordance with data received from a camera.

Figure 2:
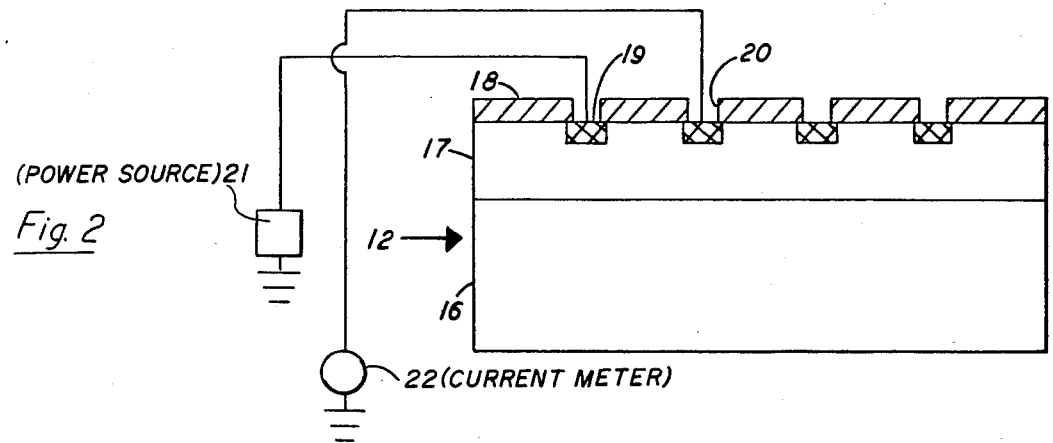
FIG. 2 is a side sectional view of a portion of an array of light emitting diodes.

FIG. 2 shows an enlarged sectional portion of the LED array 12. A typical LED array is formed on an epi-wafer of $GaAs_{0.6}P_{0.4}$, i.e., Gallium Arsenide Phosphide and comprises approximately 20,000 LED's on 13 $\mu$m centers.

The LED array 12 comprises a first layer 16 of n-type Gallium Arsenide Phosphide approximately 17 mils thick which forms the substrate of the array. Another layer 17 approximately 100 $\mu$m thick of the same material is dispositied on the layer 16. A third layer 18 of an appropriate dielectric diffusinon mask, e.g., silicon-nitride is deposited on the surface of layer 17 to a thickness of about 1000 Å. LED's 19 are formed by diffusing through openings 20 in the mask layer 18 which may be formed in any convenient manner. This is accomplished by inserting a dopant, e.g., zinc through openings 20 to convert portions of layer 17 into P type Gallium Arsenide Phosphide. The doped portion of layer 17 forms the LEDs 19 which emit light when electrons and holes recombine at the junction.

Once ohmic contacts and lead-out lines have been established, each LED 19 is illuminated individually by forward biasing the appropriate bonding pad.

Applicant has discovered that when an LED is energized, proximate unenergized LEDs have a current induced therein which is linearly proportional to the intensity of the light emitted from the energized LED. Applicant has further discovered that the current induced in unenergized LED's that are adjacent to the energized LED is three magnitudes of order higher than the current induced in the next adjacent LED, i.e., there is a strong dependence on distance between the energized and unenergized LEDs as to the amount of current induced. This makes it possible to monitor only the adjacent LED's since the response from non-adjacent LED's can be easily eliminated by appropriate circuitry.

FIG. 2 also shows a simple implementation of the invention wherein a power source 21 is connected between LED 19 and ground. A current meter 22 is connected to the LED adjacent to LED 19 and to ground. Thus, when LED 19 is energized by, e.g., a current pulse from source 21, the current in the next adjacent LED, which is not energized, is measured and gives a measure of the intensity of the light emitted by LED 19 since the current therethorugh is linearly proportional to the emitted illumination of LED 19.

The energizing current from source 21 is normally in pulse form since the LED's in the system shown in FIG. 1 are turned on for short times by data bits received in real time from the processing arrangement of such a system.

Figure 3:
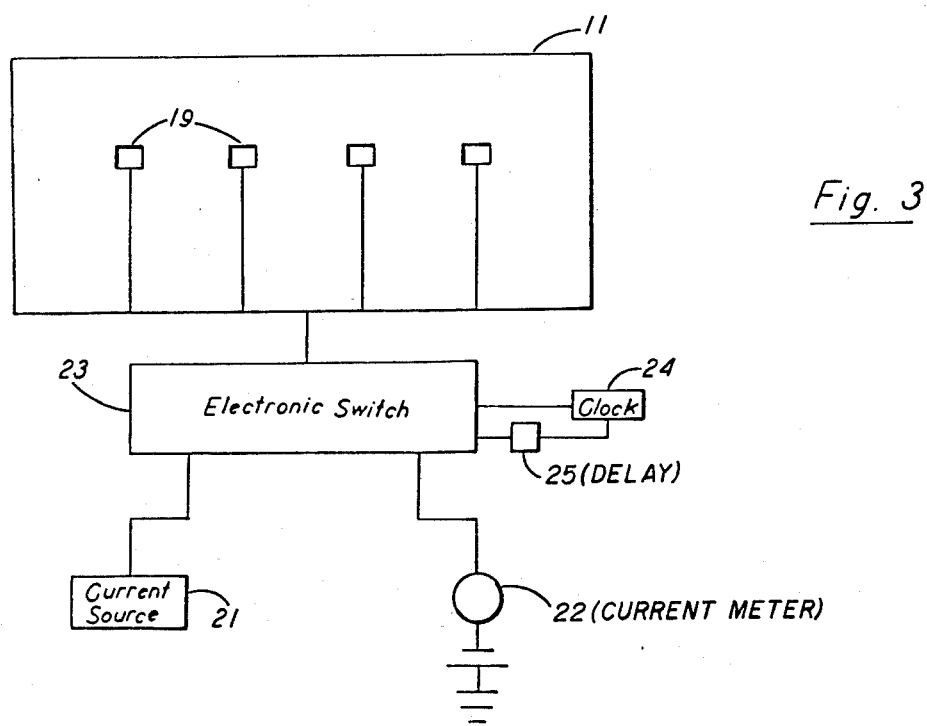
FIG. 3 is a block diagram illustrating a preferred embodiment of the present invention.

FIG. 3 illustrates a system for carrying out a preferred form of the present invention.

It comprises block 12 including LED's 19. While only five LED's are shown, it should be noted that the present invention may comprise thousands of LED's.

An electronic switch 23 is connected to current source 21 and to current measuring device 22 which may be an ammeter. Current measuring device 22 is connected to ground. A battery may be disposed between ground and current measuring device to reverse bias the unenergized LED connected to current measuring device 22 if desired. In doing so, faster switching speed and larger signal current could be activated.

The electronic switch 23 is connected to a source of clock pulses 24. The electronic switch connects the source of current to the LED's 19 in a sequential manner such that each LED is energized in turn at the clock rate of clock 24.

The clock 24 is also connected to electronic switch 23 via delay 25 which delays the clock pulses by one clock period for connecting ammeter 22 sequentially to each of the LED's in turn but delayed by one clock period so that when one LED is being energized the current through the preceeding LED's is being measured to give a measure of the intensity of light being emitted by the energized LED.

If desired a recorder may be connected to the input of ammeter 22 to maintain a permanent record of each LED testing.

Other modifications of the present invention are possible in light of the above description which should not be construed as placing limitations on the present invention other than those limitations set forth in the claims which follow:

What is claimed is:

1. An apparatus for measuring the intensity of light in a plurality of identical light emitting diodes, comprising:
    a source of current,
    switch means for connecting said source of current to at least one of said plurality of identical light emitting diodes for the energization thereof,
    a current measuring device, and
    said switch means connecting said current measuring device to an unenergized light emitting diode adjacent to said energized diode, said unenergized light emitting diode having a current induced therein linearly proportional to the intensity of light emitted by said energized light emitting diode.

2. An apparatus according to claim 1 wherein said switch means connects said source of current to each of said light emitting diodes in turn at a predetermined clock rate and said current measuring device to each of said light emitting diodes in turn at said predetermined clock rate delayed by one clock count.

3. A method for measuring the intensity of light emitted by selected ones of an array of identical light emitting diodes, comprising the steps of:
    energizing selected ones of the array of identical light emitting diodes; and
    simultaneously measuring the current through an unenergized light emitting diodes adjacent the energized light emitting diodes, said unenergized light emitting diodes having a current induced therein linearly proportional to the intensity of light emitted by the energized light emitting diodes.

* * * * *